(12) United States Patent
Yasui

(10) Patent No.: US 12,133,333 B2
(45) Date of Patent: Oct. 29, 2024

(54) MOVING WORK MANAGEMENT DEVICE

(71) Applicant: FUJI CORPORATION, Chiryu (JP)

(72) Inventor: Yoshihiro Yasui, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 873 days.

(21) Appl. No.: 17/265,638

(22) PCT Filed: Aug. 23, 2018

(86) PCT No.: PCT/JP2018/031143
§ 371 (c)(1),
(2) Date: Feb. 3, 2021

(87) PCT Pub. No.: WO2020/039541
PCT Pub. Date: Feb. 27, 2020

(65) Prior Publication Data
US 2021/0307224 A1    Sep. 30, 2021

(51) Int. Cl.
*H05K 13/08* (2006.01)
*G05B 19/042* (2006.01)
(Continued)

(52) U.S. Cl.
CPC ....... *H05K 13/0452* (2013.01); *G05B 19/042* (2013.01); *H05K 13/021* (2013.01);
(Continued)

(58) Field of Classification Search
CPC ............. H05K 13/0452; H05K 13/021; H05K 13/0417; H05K 13/086; H05K 13/0419; G05B 19/042; G05B 2219/45029
See application file for complete search history.

(56) References Cited

U.S. PATENT DOCUMENTS

2016/0249498 A1\*  8/2016  Oyama ............... H05K 13/086

FOREIGN PATENT DOCUMENTS

JP     2004-134691 A       4/2004
JP     2007019297 A   \*   1/2007
(Continued)

OTHER PUBLICATIONS

Takyu et al, "A Novel Pick-Up and Place Process for FO-WLP Using Tape Expansion Machine Device," 2017 IEEE 67th Electronic Components and Technology Conference (ECTC), Orlando, FL, USA, 2017, pp. 364-370. (Year: 2017).\*

(Continued)

*Primary Examiner* — A. Dexter Tugbang
(74) *Attorney, Agent, or Firm* — Oblon, McClelland, Maier & Neustadt, L.L.P.

(57) ABSTRACT

The mounting system includes a mounting device having a holding member, a moving work device for collecting or loading a holding member, and a moving work management device. The moving work management device comprises a management control section configured to create exchange order information including a collection order for collecting the holding member that the moving work device operates and/or a replenishment order for replenishing the holding member based on arrangement state information including the usage state of the holding member currently loaded to the mounting device and mounting condition information according to which the mounting device performs the mounting process.

9 Claims, 7 Drawing Sheets

(51) Int. Cl.
*H05K 13/02* (2006.01)
*H05K 13/04* (2006.01)

(52) U.S. Cl.
CPC ....... *H05K 13/0417* (2013.01); *H05K 13/086* (2018.08); *G05B 2219/45029* (2013.01)

(56) References Cited

FOREIGN PATENT DOCUMENTS

| | | |
|---|---|---|
| JP | 2017-224720 A | 12/2017 |
| JP | WO 2018/008148 A1 | 1/2018 |
| WO | WO 2017/033268 A1 | 3/2017 |
| WO | WO 2017/085782 A1 | 5/2017 |

OTHER PUBLICATIONS

International Search Report issued on Oct. 30, 2018 in PCT/JP2018/031143 filed on Aug. 23, 2018, 2 pages.

* cited by examiner

MOVING WORK MANAGEMENT DEVICE

TECHNICAL FIELD

The present specification discloses a moving work management device, a mounting system, and a moving work management method.

BACKGROUND ART

Conventionally, a mounting system has been proposed in which a feeder storage is placed in a production line, and an exchange robot (moving work device) is provided which moves between mounting devices and a feeder storage section and exchanges feeders between the mounting devices and the feeder storage section (see Patent Document 1, for example). In this mounting system, since the feeder used in any of the mounting devices can be replenished or collected at the feeder storage section, replenishment or collection of feeders can easily be performed by an operator.

PATENT LITERATURE

Patent Document 1: International Publication No. 2017/033268

BRIEF SUMMARY

Technical Problem

However, even though the moving work device automatically exchanges feeders in the mounting system of Patent Document 1, no consideration has been given to how the exchange is to be performed. For example, in a mounting device, there are cases in which a moving work device cannot perform an operation as scheduled when, for example, an operator extracts a feeder from an unscheduled slot or loads a feeder to unscheduled empty slot to deal with a change in the production schedule, an unexpected shortage of components, or the like.

It is a principal object of the present disclosure to provide a moving work management device, a mounting system, and a moving work management method capable of more reliably performing work with a moving work device.

The present disclosure adopts the following means to achieve the main object described above.

The moving work management device of the present disclosure is a moving work management device configured to be used in a mounting system having a mounting device and a moving work device, the mounting device comprising: a mounting section configured to mount a component on a mounting target, a supply section having a loading section for loading a holding member configured to hold the component, and a mounting control section configured to cause the mounting section to pick up the component from the holding member; and the moving work device comprising: a moving control section configured to move the holding member to be collected from the supply section or be replenished to the supply section; and the moving work management device comprises a management control section configured to create exchange order information including a collection order for collecting the holding member that the moving work device operates and/or a replenishment order for replenishing the holding member based on arrangement state information including the usage state of the holding member currently loaded to the mounting device and mounting condition information according to which the mounting device performs the mounting process.

Generally, in a mounting system, the arrangement state or the number of remaining components of a holding member on a mounting device changes in daily production and may differ from a predetermined arrangement state or number of remaining components. In this moving work management device, since the exchange order (collection order or replenishment order) of the holding member is set using the current arrangement state of the mounting device and the mounting condition information used for production, the holding member can be exchanged in accordance with the actual arrangement state of the holding member. In this way, in the moving work management device, it is possible to perform work with the moving work device more reliably. Examples of a holding member include a tape holding components, a tray holding components, and the like. In the mounting device, a feeder having a holding member may be loaded to the loading section.

DESCRIPTION OF EMBODIMENTS

Figure 1:
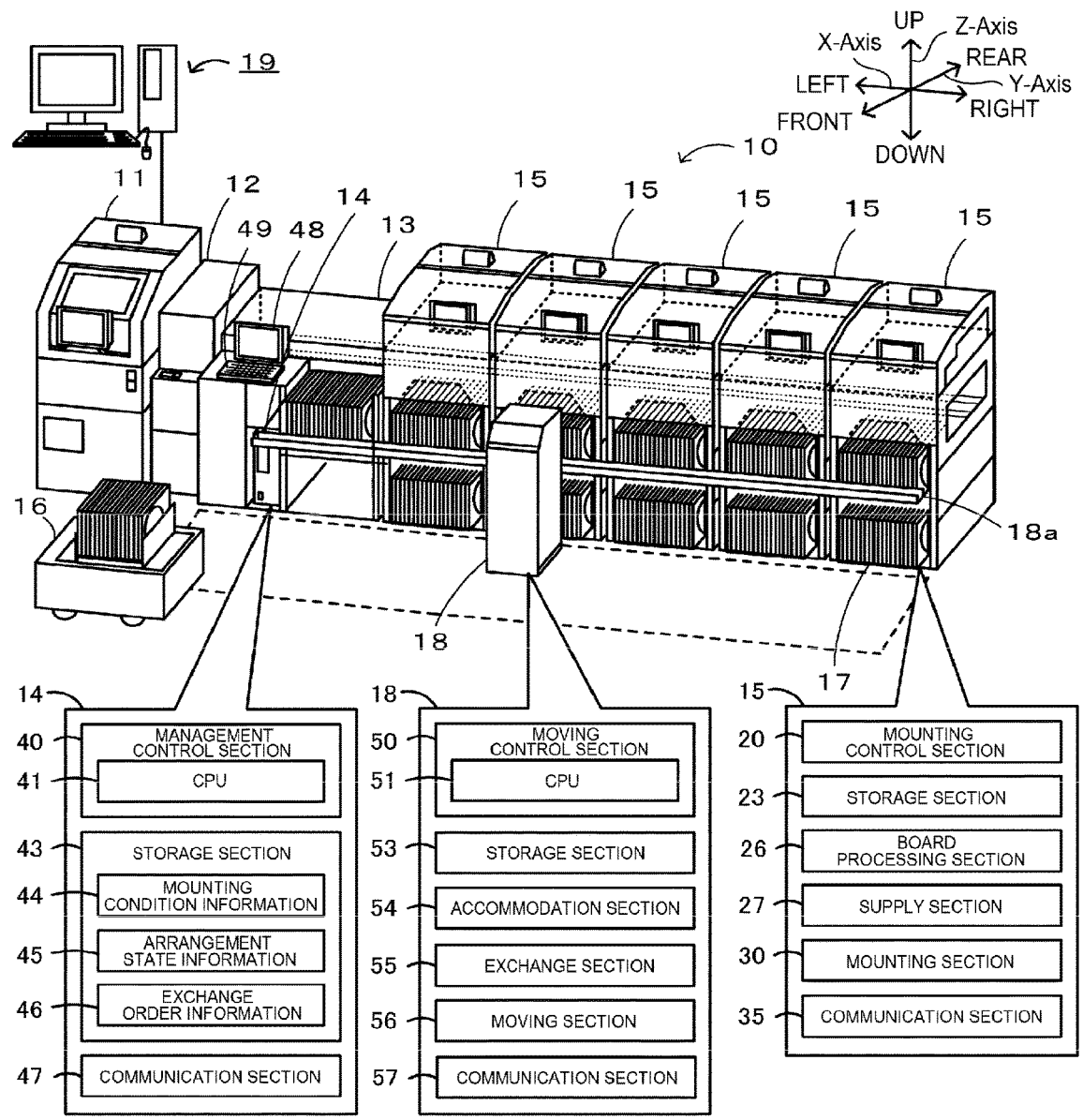
FIG. 1 is a schematic diagram showing an example of mounting system 10.
Figure 2:
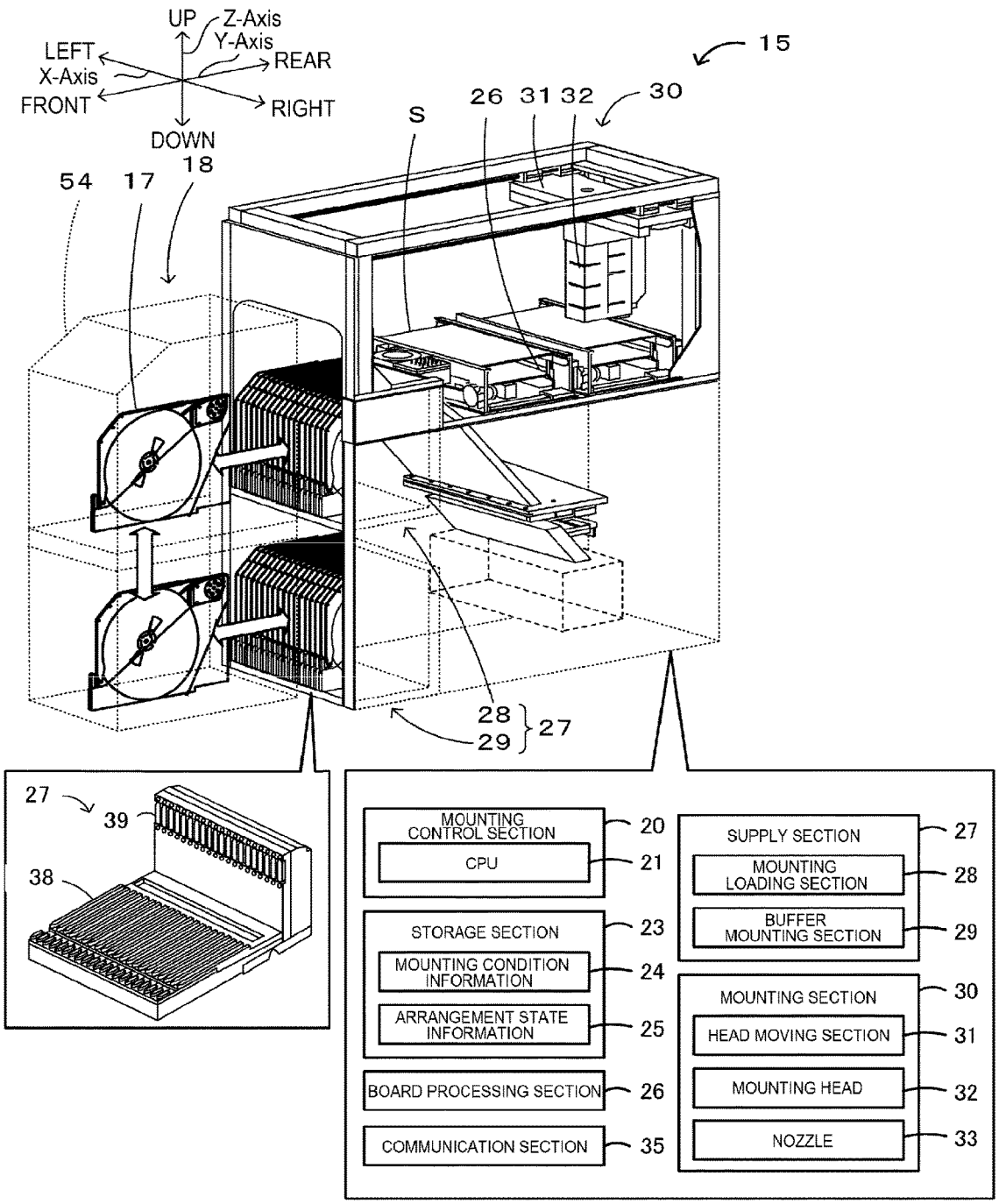
FIG. 2 is a diagram schematically showing a configuration of mounting device 15 and loader 18.
Figure 3:
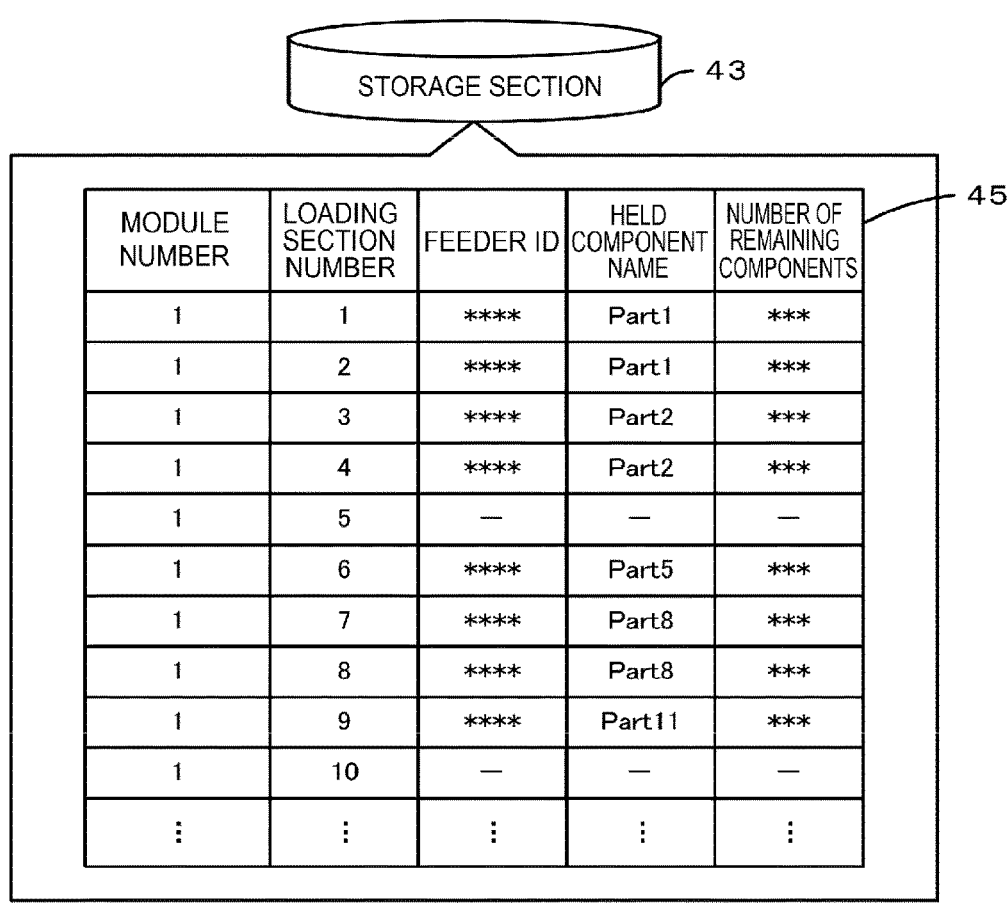
FIG. 3 is a diagram showing an example of arrangement state information 45 stored in storage section 43.
Figure 4:
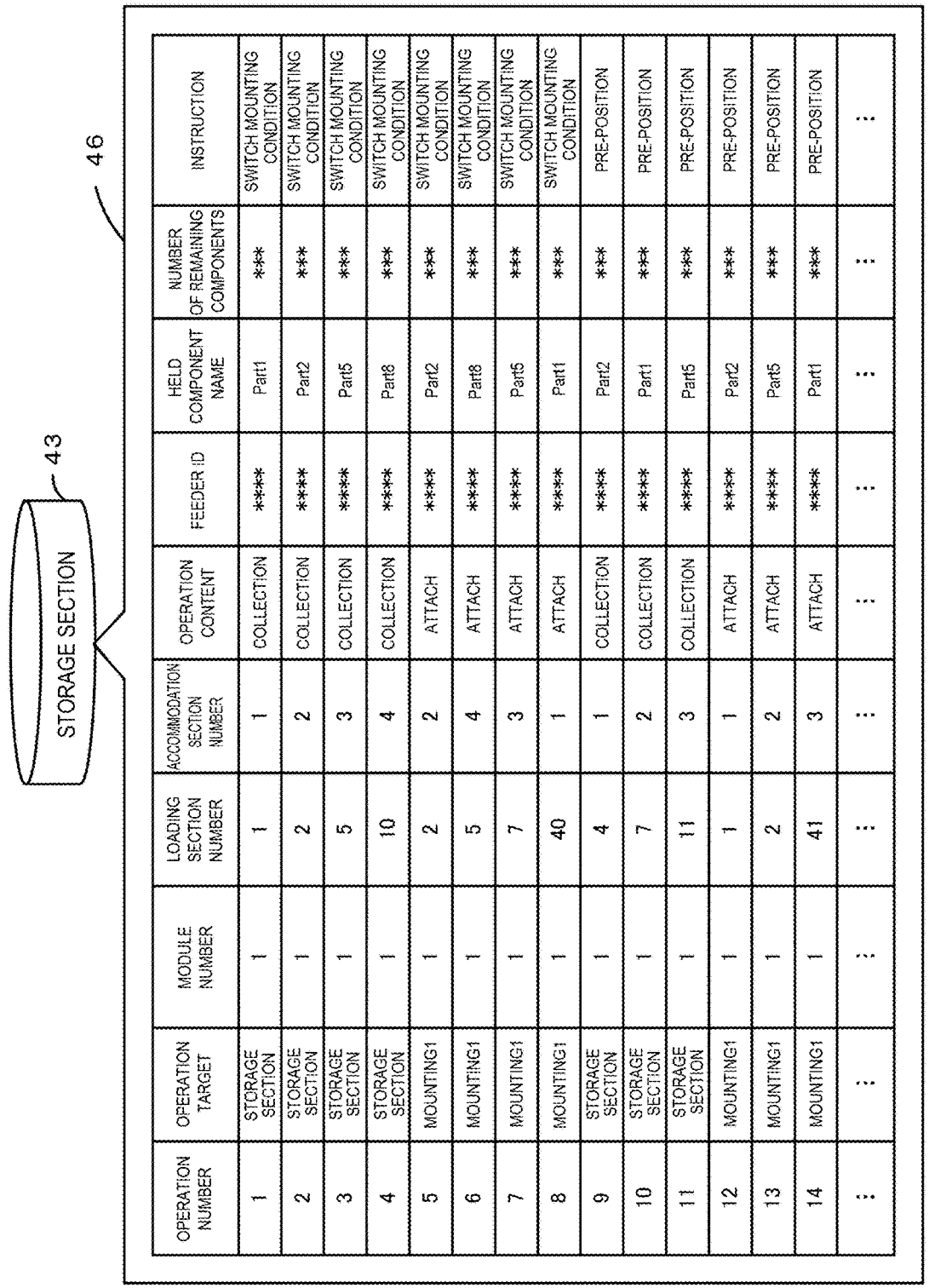
FIG. 4 is a diagram showing an example of exchange order information 46 stored in storage section 43.

The present embodiment will be described below with reference to the drawings. FIG. 1 is a schematic diagram showing an example of mounting system 10 of the present disclosure. FIG. 2 is a diagram schematically showing a configuration of mounting device 15 and loader 18 which is a moving work device. FIG. 3 is a diagram showing an example of arrangement state information 45 stored in storage section 43 of management PC 14. FIG. 4 is a diagram showing an example of exchange order information 46 stored in storage section 43 of management PC 14. In the present embodiment, the left-right direction (X-axis), the front-rear direction (Y-axis), and the up-down direction (Z-axis) are as shown in FIGS. 1 and 2.

Mounting system 10 is configured, for example, as a production line in which devices are arranged in the conveyance direction of board S, the devices being devices for performing processes to mount components on board S which is a mounting target. Here, the mounting target is described as board S, but the present disclosure is not particularly limited to this as long as the object is an object on which components are mounted and may be a substrate having a three-dimensional shape. As shown in FIG. 1, mounting system 10 includes printing device 11, print inspection device 12, feeder storage section 13, management PC 14, mounting device 15, automatic conveyance vehicle 16, loader 18, host PC 19, and the like. Printing device 11 is a device for printing solder paste or the like on board S. Print inspection device 12 is a device for inspecting the state of the printed solder. Feeder storage section 13 is a storage location for storing feeder 17 used in mounting device 15. Feeder storage section 13 is provided below the conveyance device between print inspection device 12 and mounting device 15.

Mounting device 15 is a device for picking up components and mounting components on board S. Mounting device 15 includes mounting control section 20, storage section 23, board processing section 26, supply section 27, mounting section 30, and communication section 35. As shown in FIG. 2, mounting control section 20 is configured as a microprocessor centered on CPU 21 and controls the entire device. Mounting control section 20 outputs control signals to board processing section 26, supply section 27, and mounting section 30, and receives signals from board processing section 26, supply section 27, and mounting section 30. Storage section 23 stores mounting condition information 24, arrangement state information 25, and the like. Mounting condition information 24 is a production job and includes information such as information on components, the arrangement order in which components are mounted on board S, arrangement positions, and loading positions of feeders 17 from which components are picked up. Mounting condition information 24 is created by host PC 19 with an order and arrangement in which the mounting efficiency is high, transmitted from host PC 19, and stored in storage section 23. Arrangement state information 25 is the same information as arrangement state information 45 and will be described in detail later. Mounting device 15 acquires mounting condition information 24 from host PC 19 and creates arrangement state information 25 by itself. Communication section 35 is an interface for exchanging information with external devices such as management PC 14 and host PC 19.

Board processing device 26 is a unit for conveying in board S, transporting board S, securing board S at a mounting position, and conveying out board S. Board processing device 26 has a pair of conveyor belts extending in the left-right direction and spaced apart from each other in the front-rear direction in FIG. 1. Board S is conveyed by the conveyor belts.

Supply section 27 is a unit for supplying components to mounting section 30. Supply section 27 loads feeders 17 to one or more loading sections, each feeder 17 having a reel around which a tape serving as a holding member for holding components is wound. As shown in FIG. 2, supply section 27 has two loading sections, that is, an upper and a lower loading section, to which feeder 17 can be loaded in the front direction. The upper stage is mounting loading section 28 from which a component can be extracted by mounting section 30, and the lower stage is buffer loading section 29 from which a component cannot be extracted by mounting section 30. Here, mounting loading section 28 and buffer loading section 29 are collectively referred to as the loading section. The loading sections may be managed in module units grouping a predetermined number of feeders 17 (e.g., 4 or 12). Supply section 27 has multiple slots 38, arranged in the X-direction at predetermined intervals and into which rail members of feeders 17 are inserted, and connecting portions 39 into which connectors provided at the distal ends of feeders 17 are inserted. Each feeder 17 includes a controller (not shown). The controller stores information such as tape IDs and component types included in feeder 17 and the remaining number of components. When feeder 17 is connected to connecting portion 39, the controller transmits information of feeder 17 to mounting control section 20.

Mounting section 30 is a unit for picking up components from supply section 27 and arranges the components on board S fixed to board processing section 26. Mounting section 30 includes head moving section 31, mounting head 32, and nozzle 33. Head moving section 31 includes a slider guided by guide rails and moved in the XY-direction, and a motor for driving the slider. Mounting head 32 is configured to pick up one or more components and be moved in the XY-direction by head moving section 31. Mounting head 32 is attached to the slider in a detachable manner. One or more nozzles 33 are attached to the lower face of mounting head 32 in a detachable manner. Nozzle 33 is configured to pick up components by use of negative pressure. Aside from nozzle 33, the pickup member for picking up components may be a mechanical chuck or the like that mechanically holds components.

Management PC 14 is a device for managing feeder 17 and is a moving work management device for creating execution data executed by loader 18. Management PC 14 includes management control section 40, storage section 43, communication section 47, display section 48, and input device 49. Management control section 40 is configured as a microprocessor centered on CPU 41 and controls the entire device. Storage section 43 is a device such as an HDD for storing various data such as a processing program. Communication section 47 is an interface for exchanging information with external devices such as mounting device 15 and host PC 19. Display section 48 is a liquid crystal display for displaying various information. Input device 49 includes a keyboard, a mouse, and the like through which an operator inputs various commands. As shown in FIGS. 1, 3, and 4, storage section 43 stores mounting condition information 44, arrangement state information 45, exchange order information 46, and the like. Mounting condition information 44 is the same as mounting condition information 24 and is acquired from host PC 19. As shown in FIG. 3, arrangement state information 45 is information including the type and the usage state of feeder 17 (component type, remaining number of components, etc.) that is currently installed in supply section 27 of mounting device 15. Arrangement state information 45 includes the module number of supply section 27, the loading section number indicating the position of the loading section, the ID of feeder 17 loaded to the loading section, the name of the component held by feeder 17, the number of remaining components, and the like. Arrangement state information 45 is appropriately updated with current information when feeder 17 is loaded or unloaded. Exchange order information 46 is information including a collection order for collecting and processing feeder 17 to be operated by loader 18 and/or a replenishment order for replenishing feeder 17. Exchange order information 46 is information created by management PC 14 based on arrangement state information 45 including the usage state of feeder 17 currently installed in mounting device 15 and mounting condition information 44 to be used in mounting by mounting device 15. As shown in FIG. 4, exchange order information 46 includes information such as the operation number which is the order in which operations are performed, an operation target, module number of supply section 27, a loading section number that is the position of the loading section of supply section 27, the number of accommodation section 54 that accommodates feeder 17, the content of the collection or replenishment operation, identification information (ID) of feeder 17 that is the operation target, the name of the component held by feeder 17 and the number of remaining components thereof, and information on the driving timing. For example, in operation number 1 of exchange order information 46 in FIG. 4, an operation of collecting feeder 17 stored in the first slot of feeder storage section 13 into the first slot of accommodation section 54 is defined. Management PC 14 outputs exchange order information 46 to loader 18 and causes loader 18 to execute the exchange process for moving feeder 17.

Automatic conveyance vehicle 16 is configured to automatically convey feeder 17, a member used in mounting system 10, and the like between a storage chamber (not shown) and feeder storage section 13.

Loader 18 is a moving work device and is a device that moves within a moving area at the front face of mounting system 10 (see dashed lines in FIG. 1) and automatically collects and replenishes feeders 17 of mounting device 15. Loader 18 includes moving control section 50, storage section 53, accommodation section 54, exchange section 55, moving section 56, and communication section 57. Moving control section 50 is configured as a microprocessor centered on CPU 51 and controls the entire device. Storage section 53 is an HDD or the like for storing various data such as processing programs and stores exchange order information 46. Accommodation section 54 has an accommodation space for accommodating feeders 17. Accommodation section 54 is configured to accommodate, for example, four feeders 17. Exchange section 55 is a mechanism for moving feeder 17 in and out as well between the upper and lower levels (see FIG. 2). Exchange section 55 has a clamp for clamping feeder 17, a Y-axis slider for moving the clamp in the Y-axis direction (front-rear direction), and a Z-axis slider for moving the clamp in the Z-axis direction (up-down direction). Exchange section 55 loads and unloads feeder 17 at mounting loading section 28 and loads and unloads feeder 17 at buffer loading section 29. Moving section 56 is a mechanism for moving loader 18 in the X-axis direction (the left-right direction) along X-axis rail 18a disposed on the front face of mounting device 15. Communication section 57 is an interface for exchanging information with external devices such as management PC 14 and mounting device 15. Loader 18 outputs the current position and the contents of the executed operation to management PC 14.

Host PC 19 (see FIG. 1) is configured as a server for managing information of each device in mounting system 10. Host PC 19 includes a control section for controlling the entire device, a storage section for storing various information, and a communication section for performing bidirectional communication with external devices such as mounting system 10, automatic conveyance vehicle 16, and loader 18. Host PC 19 acquires and manages information of mounting system 10 in addition to creating and managing condition information used in the mounting of components.

Figure 5:
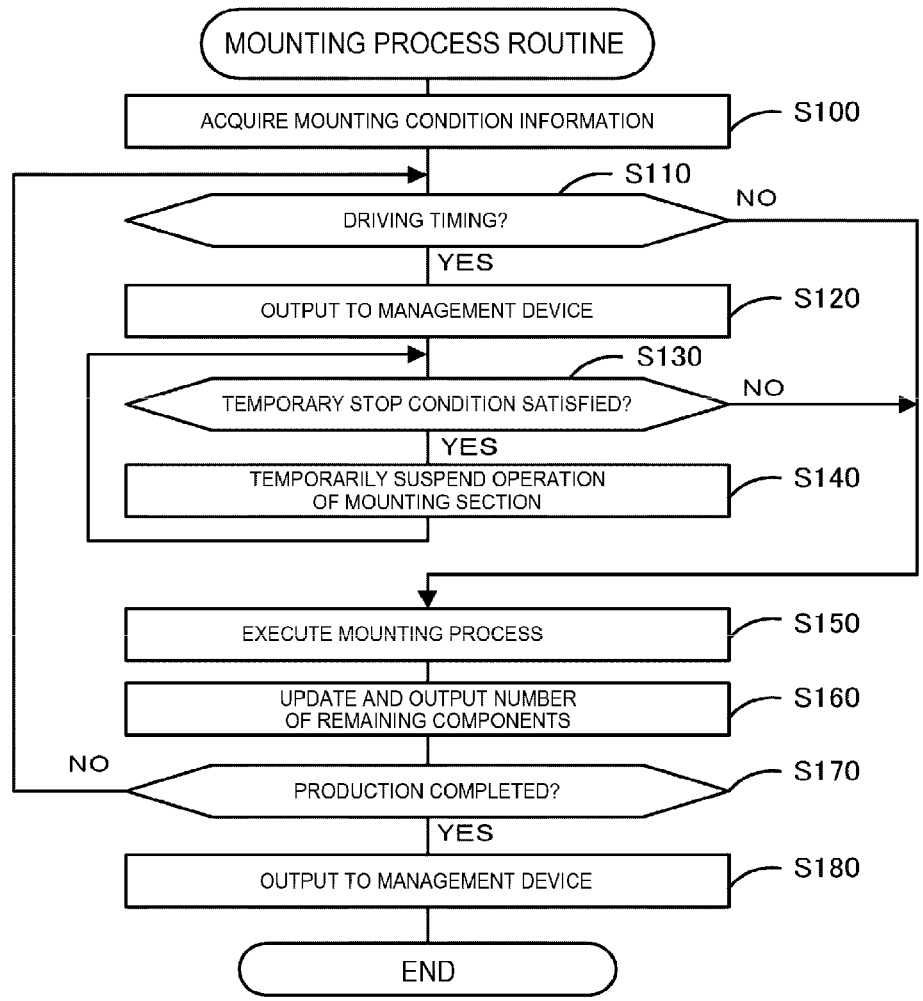
FIG. 5 is a flowchart showing an example of a mounting process routine.

Next, among the operations of mounting system 10 of the present embodiment configured as described above, the process by which mounting device 15 mounts a component on board S will be described first. FIG. 5 is a flowchart showing an example of a mounting process routine executed by CPU 21 included in mounting control section 20 of mounting device 15. This routine is stored in storage section 23 of mounting device 15 and executed in accordance with a start instruction from an operator. When this routine is started, CPU 21 first acquires mounting condition information 24 of board S to be manufactured at this time (S100). CPU 21 acquires mounting condition information 24 from host PC 19. Next, CPU 21 determines whether the present time is a predetermined driving timing (S110). The driving timing is a timing at which feeder 17 needs to be moved or exchanged and includes, for example, a transmission timing of the mounting condition information 24 at the start of production, a switching timing of the next mounting condition information 24, a component depletion timing of feeder 17, an advance notification timing at which a notification of component depletion of feeder 17 is made in advance, a loading timing at which feeder 17 is loaded to the loading section by an operator, a loading release timing at which feeder 17 is released from the loading section by an operator, and the like. Further, the driving timing may include, for example, on/off timings of operation switches of feeder storage section 13, a preliminary placement timing at which feeder 17 to be used in the next production of board S is disposed in the vicinity of the mounting position, a completion timing of the production plan in which all the mounting processes are completed, and the like. For example, CPU 21 determines the first acquisition of mounting condition information 24 after booting up mounting system 10 to be the transmission timing, determines the acquisition of mounting condition information 24 when production is not completed to be the switching timing, determines the timing at which component depletion of feeder 17 is detected to be the component depletion timing, determines the timing at which the number of remaining components is equal to or less than an advanced notification number to be the advance notification timing, determines the timing at which feeder 17 is loaded to the loading section without the operation of loader 18 to be the loading timing, and determines the timing at which feeder 17 is unloaded from the loading section without the operation of loader 18 to be the loading release timing. At these driving timings, the loading position of feeder 17 is changed.

When it is determined in S110 that the driving timing is set, CPU 21 outputs information to management PC 14 indicating which driving timing is set (S120) and determines whether a temporary stop condition has been satisfied (S130). For example, CPU 21 determines that the temporary stop condition is satisfied when all feeders 17 to be used are not loaded to supply section 27, for example, when the setup change of feeder 17 is not completed, when feeder 17 being used is released from being loaded, or the like. If it is determined in S130 that the temporary stop condition is satisfied, CPU 21 suspends operation of mounting section 30 (S140) and executes the processes of S130 and subsequent steps. That is, when an affirmative determination continues in S130, the temporary stop is continued. On the other hand, when it is not the driving timing in S110, or when the temporary stop condition is not satisfied in S130, CPU 21 executes the mounting process (S150). In the mounting process, CPU 21 causes mounting head 32 to pick up a component from feeder 17 at a predetermined position based on mounting condition information 24 and moves the component to an arrangement position of board S. Next, CPU 21 updates the number of remaining components of the used component and outputs the updated number to host PC 19 and management PC 14 (S160). Next, CPU 21 determines whether the production of board S is completed (S170) and executes the processes of S110 and subsequent steps if production is not completed. On the other hand, when production is completed in S170, CPU 21 outputs information indicating that production is completed to host PC 19 or management PC 14 (S180) and terminates this routine.

Figure 6:
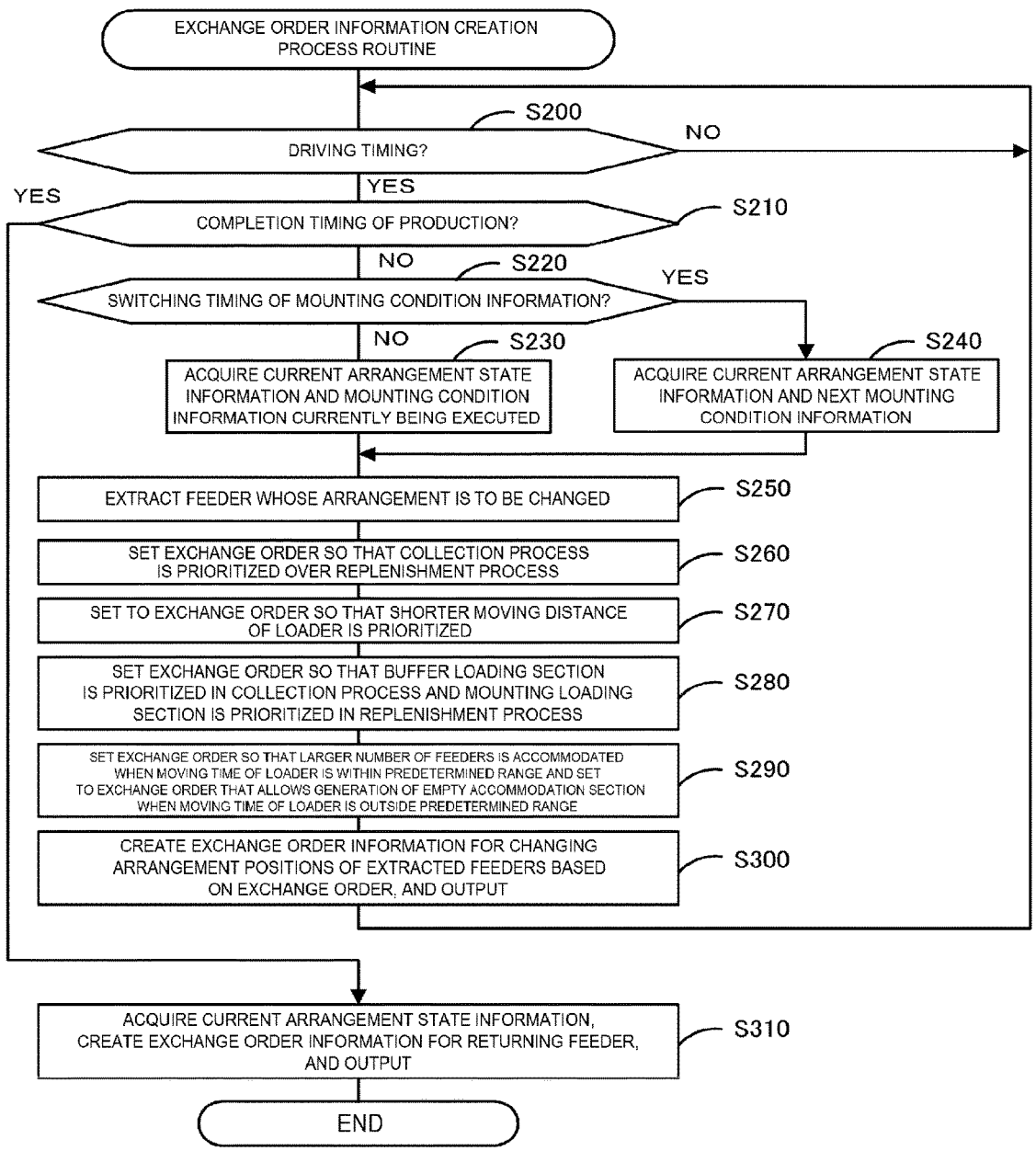
FIG. 6 is a flowchart showing an example of an exchange order information creation process routine.

Next, the process for creating the work contents of loader 18 performed by management PC 14 will be described. FIG. 6 is a flowchart showing an example of an exchange order information creation process routine executed by CPU 41 included in management control section 40 of management PC 14. This routine is stored in storage section 43 of management PC 14 and executed after the booting up of mounting system 10. When this routine is started, CPU 41 first determines whether the present time is a driving timing (S200). CPU 41 performs this determination based on information acquired from mounting device 15. When the present time is a driving timing, CPU 41 determines whether the driving timing is the completion timing of production of board S (S210). If the driving timing is not the completion timing, CPU 41 determines whether the driving timing is the switching timing of mounting condition information 24 (S220). If the driving timing is not the switching timing, CPU 41 acquires the current arrangement state information 45 and mounting condition information 44 currently being executed (S230), and executes a process for setting the exchange order of feeder 17 (S250 to S300). The case where the timing is not the switching timing corresponds to a case where mounting condition information 44 that is currently used is continuously used, such as the transmission timing, the component depletion timing, the advance notification timing, the loading timing, the loading release timing, the on/off timing, and the like. On the other hand, when the driving timing is the switching timing in S220, CPU 41 acquires the current arrangement state information 45 and mounting condition information 44 to be executed next time (S240) and executes the process for setting the exchange order of feeder 17 (S250 to S300).

In setting the exchange order, CPU 41 first extracts feeder 17 whose arrangement state is to be changed, that is, feeder 17 that needs to be moved (S250). Next, CPU 41 creates an exchange order of feeder 17 based on the priorities prescribed in steps S260 to 290 (S300). That is, CPU 41 sets an exchange order in which the collection process is prioritized over the replenishment process (S260). In particular, CPU 41 collects unnecessary feeders 17 installed in mounting section 28 and prioritizes the process of moving feeders 17 to buffer mounting section 29 or feeder storage section 13. Next, CPU 41 sets an exchange order that prioritizes a shorter moving distance of loader 18 in the collection and replenishment processes (S270). Next, CPU 41 sets an exchange order in which buffer mounting section 29 is prioritized over feeder storage section 13 as the moving destination of feeder 17 in the collection process, and mounting section 28 is prioritized over buffer mounting section 29 as the moving destination of feeder 17 in the replenishment process (S280). Next, CPU 41 prioritizes the accommodation of feeders 17 in a larger number of accommodation sections 54 when the moving time of loader 18 based on the positions of feeders 17 to be exchanged is within a predetermined range and sets the exchange order to allow the generation of an empty accommodation section 54 when the moving time is outside the predetermined range (S290). As described above, based on the priority, CPU 41 sets the exchange order so that unnecessary feeders 17 loaded to mounting loading section 28 are collected and moved to buffer mounting section 29 or feeder storage section 13 so that the moving distance of loader 18 is shortened, and moved from buffer mounting section 29 or feeder storage section 13 so that the moving distance is shortened between loader 18 and feeders 17 that are to be loaded to mounting loading section 28.

Subsequently, CPU 41 creates exchange order information 46 including the set exchange order and causes loader 18 to output exchange order information 46 to loader 18 (S300). At this juncture, CPU 41 may create exchange order information 46 including the replenishment process data for the replenishment process in which feeder 17 is replenished to empty loading sections of supply section 27 prior to the production of board S. In the replenishment process, for example, feeder 17 for exchanging may be loaded to an empty slot of mounting loading section 28 or loaded to buffer loading section 29 at a position closer to the feeder for which a notification has been made. In addition, CPU 41 may create exchange order information 46 including the replenishment process data for replenishing feeder 17 for exchange in the vicinity of feeder 17 for which an advanced notification of a shortage of components has been made. In addition, CPU 41 may create exchange order information 46 including moving process data for performing the moving process to move feeder 17 to the use position when production of board S is started. Alternatively, CPU 41 may arrange feeder 17 in buffer mounting section 29 as a replenishment process and create exchange order information 46 for moving feeder 17 from buffer mounting section 29 to the use position of mounting loading section 28 at the start of board S production as a moving process. In addition, when feeder 17 not scheduled to be used by an operator is loaded to supply section 27, CPU 41 may create exchange order information 46 for moving feeder 17 to buffer loading section 29 or feeder storage section 13. In addition, CPU 41 may create exchange order information 46 for returning feeder 17 equivalent to feeder 17 to supply section 27 when feeder 17 is released from supply section 27 by the operator. Loader 18 that has received exchange order information 46 then executes the movement of feeder 17 in a feeder exchange process routine described later.

After S300 or when the present time is not the driving timing in S200, CPU 41 executes the processes in S200 and subsequent steps. On the other hand, when the driving timing is the completion timing of the production of board S in S210, CPU 41 acquires the current arrangement state information 45, sets the exchange order for returning feeder 17 loaded to mounting loading section 28 to buffer loading section 29 or feeder storage section 13, creates exchange order information 46 including the set exchange order, outputs exchange order information 46 to loader 18 (S310), and terminates the routine.

For example, in exchange order information 46 created before production of board S is started, since feeder 17 is not loaded to mounting loading section 28, as shown in FIG. 4, an exchange order is set for receiving feeder 17 in feeder storage section 13 and moving feeder 17 to mounting loading section 28. On the other hand, in exchange order information 46 created at the time of setup change, an exchange order in which feeder 17 loaded to mounting loading section 28 is retracted to buffer mounting section 29, an exchange order in which, for example, feeder 17 is returned to feeder storage section 13 is preferentially employed. Further, when the production of board S is completed, an exchange order or the like for returning feeder 17 mounted on mounting section 28 to feeder storage section 13, or retracting feeder 17 of mounting section 28 to buffer mounting section 29 is created.

Figure 7:
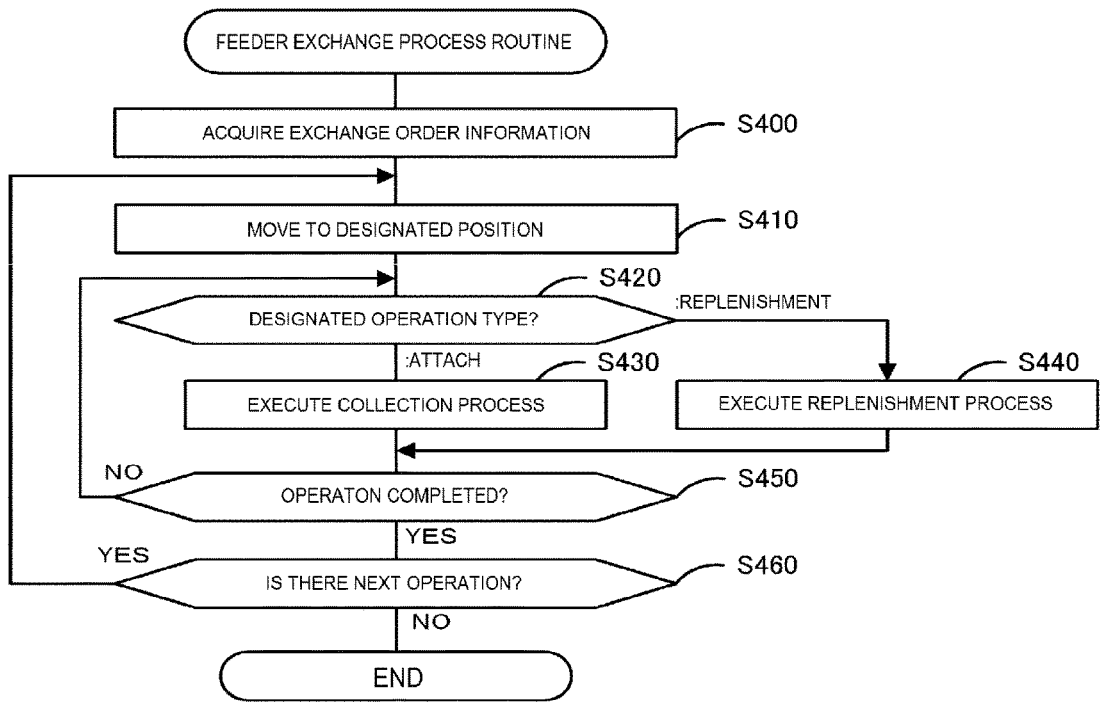
FIG. 7 is a flowchart showing an example of a feeder exchange process routine.

Next, the feeder exchange process executed by loader 18 that has acquired exchange order information 46 will be described. FIG. 7 is a flowchart showing an example of a feeder exchange process routine executed by CPU 51 included in moving control section 50 of loader 18. This routine is stored in storage section 53 of loader 18 and is executed after acquiring exchange order information 46 after loader 18 is activated. When this routine is started, CPU 51 first acquires exchange order information 46 (S400) and moves accommodation section 54 to the designated position defined in exchange order information 46 (S410). Next, CPU 51 determines whether the specified operation is collection (reception) or replenishment (S420), and when it is collection, CPU 51 executes a collection process to release feeder 17 from the loading and cause accommodation section 54 to accommodate feeder 17 (S430). On the other hand, in S420, when the specified operation is replenishment (loading), a replenishment process is executed to cause feeder 17 accommodated in accommodation section 54 to load to the specified position (S440). After S440 or after S430, CPU 51 determines whether the specified operation is completed (S450) and continues the processes of S420 and subsequent steps when the specified operation is not completed. On the other hand, when the operation specified in S450 is completed, it is determined whether there is a next operation (S460), and when there is a next operation, CPU 51 repeatedly executes the processes of S410 and subsequent steps. On the other hand, when there is no next operation in S460, CPU 51 terminates this routine.

Here, the correspondence between the constituent elements of the present embodiment and the constituent elements of the present disclosure will be specified. Mounting device 15 of the present embodiment corresponds to a mounting device, management PC 14 corresponds to a moving work management device, and loader 18 corresponds to a moving work device. In addition, supply section 27 corresponds to a supply section, mounting section 28 and buffer mounting section 29 correspond to a mounting section, mounting section 30 corresponds to a mounting section, and mounting control section 20 corresponds to a mounting control section. In addition, accommodation section 54 corresponds to an accommodation section, and moving control section 50 corresponds to a moving control section. In addition, mounting condition information 44 corresponds to mounting condition information, arrangement state information 45 corresponds to arrangement state information, exchange order information 46 corresponds to exchange order information, and management control section 40 corresponds to a management control section. In addition, feeder storage section 13 corresponds to a storage section, the tape corresponds to a holding member, and board S corresponds to a mounting target.

Mounting system 10 described above can exchange feeder 17 in accordance with the actual arrangement of feeder 17 to set the exchange order (collection order or replenishment order) of feeder 17 using arrangement state information 45 including the arrangement of feeder 17 in the current mounting device 15 and mounting condition information 44 used for production. Accordingly, in management PC 14, the operation by loader 18 can be performed more reliably. Further, management control section 40 creates exchange order information 46 using the following priorities: (1) prioritize the collection process over the replenishment process; (2) prioritize the exchange order in which the moving distance of loader 18 is shorter; (3) prioritize buffer loading section 29 as the moving destination of feeder 17 over feeder storage section 13 in collection processes but prioritize mounting loading section 28 over buffer loading section 29 in replenishment processes; and (4) prioritize the accommodation of the holding members in a larger number of accommodation sections when the moving time of loader 18 based on the positions of feeders 17 to be exchanged is within a predetermined range and allow the generation of an empty accommodation section when the moving time is outside the predetermined range. In management PC 14, since the exchange order is set using the priorities described above, it is possible to perform more efficient exchange work in accordance with the adopted response. Further, management control section 40 creates exchange order information 46 including replenishment process data for performing replenishment processes for replenishing feeder 17 to the empty loading section of supply section 27 prior to production of board S and/or moving process data for performing moving processes for moving feeder 17 to the use position when production of board S is started. In management PC 14, the operation by loader 18 can be more reliably performed in the replenishment process of feeder 17 or the moving process of the holding member.

Further, management control section 40 arranges feeder 17 in buffer loading section 29 as a replenishment process and creates exchange order information 46 for moving feeder 17 loaded to buffer loading section 29 to mounting loading section 28 as a moving process in which feeder 17 is moved to the use position when production of board S is started. In management PC 14, the operation by loader 18 can be more reliably performed in the replenishment process of feeder 17 or the moving process of feeder 17. Further, management control section 40 creates exchange order information 46 in accordance with a driving timing including one or more of a switching timing of the next mounting condition information 44, a component depletion timing of feeder 17, a loading timing at which feeder 17 is loaded to the loading section by an operator, and a loading release timing at which feeder 17 is released from the loading section by the operator. In management PC 14, the operation by loader 18 can be more reliably performed in accordance with the driving timing at which a change occurs from a scheduled arrangement of the holding member. Furthermore, management control section 40 acquires arrangement state information 45 including the position and number of remaining components of feeder 17 loaded to supply section 27 of mounting device 15 in accordance with a predetermined driving timing. In this management PC 14, since arrangement state information 45 is acquired at necessary timings, it is possible to perform the work with loader 18 with higher processing efficiency. Management control section 40 then creates exchange order information 46, which is the exchange order of feeders 17 that need to be changed from the currently loading state of feeder 17 in the loading section. In management PC 14, since the exchange order is created for feeder 17 that needs to be changed, it is possible to efficiently perform the operation by loader 18 with higher reliability. Management control section 40 outputs the created exchange order information 46 to an external device including one or more of mounting devices 15, loader 18, and host PC 19. In management PC 14, exchange order information 46 can be used in each device of mounting system 10.

It is obvious that the present disclosure is not limited to the above-described embodiments and can be implemented in various modes as long as the modes belong to the technical scope of the present disclosure.

For example, although the exchange order is set using the priorities of (1) to (4) in the above embodiment, the present disclosure is not particularly limited to this. The exchange order may be set by adding to or using priorities changed from the above.

In the above embodiment, exchange order information 46 is created including the replenishment process for replenishing feeder 17 prior to production of board S, the moving process for moving feeder 17 to the use position when production of board S is started, or the like, but is not particularly limited to this, and one or more of these may be omitted, or the exchange order may be set with other processes.

In the above embodiment, exchange order information 46 is created in accordance with the driving timing including one or more of the switching timing, the component depletion timing, the advance notification timing, the loading timing, the loading release timing, and the completion timing, but is not particularly limited to this, and one or more of these may be omitted, or exchange order information 46 may be created at a timing other than these. In addition, although management PC 14 acquires arrangement state information 45 in accordance with the driving timing, the present disclosure is not particularly limited to this.

In the above embodiment, exchange order information 46 is created that is the exchange order of feeders 17 that need to be changed from the currently loading state of feeder 17 to the loading section, but the present disclosure is not particularly limited to this, and exchange order information 46 including feeders 17 that do not need to be changed may be created.

In the above embodiment, the holding member for holding the component is described as a tape to be loaded to feeder 17, but the present disclosure is not particularly limited to this, and the holding member may be a tray for holding the component.

In the above embodiment, mounting system 10 includes printing device 11, print inspection device 12, feeder storage 13, management PC 14, and mounting device 15, but the present disclosure is not particularly limited thereto, and one or more of the above devices may be omitted or other devices may be added.

In the above embodiment, management PC 14 installed in feeder storage section 13 has been described as managing loader 18, but the present disclosure is not particularly limited to this and may be provided with this function in other devices such as host PC 19, mounting device 15, and loader 18, for example. In the above embodiment, loader 18 is configured to load or collect feeder 17, but the present disclosure is not particularly limited thereto, and may be configured so that automatic conveyance vehicle 16 loads and collects feeder 17.

In the above embodiment, the present disclosure is applied to a mode of mounting system 10, but the present disclosure may be applied to management PC 14 (moving work management device) or loader 18 (moving work device), or may be applied to the management method of a moving work device.

Here, the moving work management device, the mounting system, and the moving work management method according to the present disclosure may be configured as follows. For example, in the moving work management device of the present disclosure, the management control section may create the exchange order information using one or more of priorities (1) to (3). In this moving work management device, since the exchange order is set using the following priorities, it is possible to perform more efficient exchange work in accordance with the adopted response. (1) The collection process is prioritized over the replenishment process. (2) Priority is given to the collection process or the replenishment process based on the exchange order that yields a shorter moving distance for the moving work device. (3) The supply section has a mounting loading section and a buffer loading section, and the mounting system has a storage section, aside from the mounting device, configured to store the holding member and prioritizes the buffer loading section over the storage section as the moving destination of the feeder in the collection process and prioritizes the mounting loading section over the buffer loading section as the moving destination of the holding member in the replenishment process. (4) The moving work device has two or more accommodation sections configured to accommodate the holding member, and prioritizes accommodating the holding members in a larger number of accommodation sections when the moving time of the moving work device based on the positions of the holding members to be exchanged is within a predetermined range and allows the creation of an empty accommodation section when the moving time is outside the predetermined range.

In the moving work management device of the present disclosure, the management control section creates the exchange order information including replenishment process data for performing replenishment processes for replenishing the holding member to the available loading section of the supply section prior to production of the mounting target and/or moving process data for performing a moving process for moving the holding member to the use position when production of the mounting target is started. In the moving work management device, work by the moving work device can be more reliably performed in the replenishment process of the holding member or the moving process of the holding member.

In the moving work management device of the present disclosure,
the mounting device has a mounting loading section in which the mounting section is capable of picking up the component and a buffer loading section in which the mounting section is incapable of picking up the component;
the management control section arranges the holding member in the buffer loading section as a replenishment process and creates the exchange order information for moving the holding member loaded to the buffer loading section as a moving process in which the holding member is moved to the use position when production of the mounting target is started. In the moving work management device, work by the moving work device can be more reliably performed in the replenishment process of the holding member or the moving process of the holding member.

In the moving work management device of the present disclosure, the management control section creates the exchange order information in accordance with a driving timing including one or more of a switching timing of the next mounting condition information, a component depletion timing of the holding member, a loading timing at which the holding member is loaded to the loading section by an operator, and a loading release timing at which the holding member is released from the loading section by the operator. In the mounting device, the arrangement of the holding member may change from a scheduled arrangement at the switching timing, the component depletion timing, the loading timing, the loading release timing, or the like. In this moving work management device, it is possible to more reliably perform work with the moving work device in accordance with predetermined driving timings. In this case, the management control section may create the exchange order information for arranging the holding member to be used in the next mounting condition information in accordance with the switching timing, and may create the exchange order information for arranging the holding member to be used in the mounting condition information currently being executed in accordance with one or more of the component deletion timing, the loading timing, and the loading release timing.

In the moving work management device of the present disclosure, the management control section may acquire the arrangement state information including the position of the holding member loaded to the supply section of the mounting device and the number of remaining components in accordance with a predetermined driving timing. In this moving work management device, since the arrangement state information is acquired at necessary timings, it is possible to perform the work with the moving work device with higher processing efficiency.

In the moving work management device of the present disclosure, the management control section may create the exchange order information, which is the exchange order of the holding members that need change from the currently loading state to the loading section. In this moving work managing device, since the exchange order is created for the holding member that needs to be changed, it is possible to efficiently perform the work with the moving work device with higher reliability.

In the moving work management device of the present disclosure, the management control section may output the created exchange order information to an external device including one or more of the mounting device, the moving work device, and the management device for managing the mounting system. In this moving work management device, the exchange order information can be used in each device of the mounting system.

The mounting system of the present disclosure includes a mounting device, a moving work device, and any one of the above-described moving work management devices, the mounting device comprising: a mounting section configured to mount a component on a mounting target, a supply section having a loading section for loading a holding member configured to hold the component, and a mounting control section configured to cause the mounting section to pick up the component from the holding member; and the moving work device comprising: a moving control section configured to move the holding member to be collected from the supply section or be replenished to the supply section. Since the mounting system includes any of the moving work management devices described above, it is possible to obtain an effect corresponding to the adopted configuration.

The moving work management method of the present disclosure is to be used in a mounting system having a mounting device and a moving work device, the mounting device comprising: a mounting section configured to mount a component on a mounting target, a supply section having a loading section for loading a holding member configured to hold the component, and a mounting control section configured to cause the mounting section to pick up the component from the holding member; and the moving work device comprising: a moving control section configured to move the holding member to be collected from the supply section or be replenished to the supply section; and the moving work management method comprises a management control step for creating exchange order information including a collection order for collecting the holding member that the moving work device operates and/or a replenishment order for replenishing the holding member based on arrangement state information including the usage state of the holding member currently loaded to the mounting device and mounting condition information according to which the mounting device performs the mounting process.

In this moving work management method, similar to the moving work management device described above, since the exchange order (collection order or replenishment order) of the holding member is set using the current arrangement state of the mounting device and the mounting condition information used for production, the holding member can be exchanged in accordance with the actual arrangement state of the holding member. Accordingly, in the moving work management method, it is possible to perform work with the moving work device more reliably. It should be noted that in this moving work management method, various modes of the above-described moving work management device may be employed, or steps for achieving each function of the above-described moving work management device may be added.

INDUSTRIAL APPLICABILITY

The present disclosure is applicable to the technological field of devices for picking up and mounting components.

REFERENCE SIGNS LIST

10 Mounting system, 11 Printing device, 12 Print inspection device, 13 Feeder storage section, 14 Management PC, 15 Mounting device, 16 Automatic conveyance vehicle, 17 Feeder, 18 Loader, 18a X-axis rail, 19 Host PC, 20 Mounting control section, 21 CPU, 23 Storage section, 24 Mounting condition information, 25 Arrangement state information, 26 Board processing section, 27 Supply section, 28 Mounting loading section, 29 Buffer loading section, 30 Mounting section, 31 Head moving section, 32 Mounting head, 33 Nozzle, 35 Communication section, 38 Slot, 39 Connecting section, 40 Management control section, 41 CPU, 43 Storage section, 44 Mounting condition information, 45 Arrangement state information, 46 Exchange order information, 47 Communication section, 48 Display section, 49 Input device, 50 Moving control section, 51 CPU, 53 Storage section, 54 Accommodation section, 55 Exchange section, 56 Moving section, 57 Communication section, S Board

The invention claimed is:

1. A moving work management device configured to be used in a mounting system having a mounting device and a moving work device,
the mounting device comprising:
a mounting head configured to mount a component on a mounting target,
a supply section having a loading section for loading a holding member configured to hold the component, and
a mounting control section configured to cause the mounting head to pick up the component from the holding member; and
the moving work device comprising:
a moving control section configured to move the holding member to be collected from the supply section or be replenished to the supply section; and
the moving work management device comprises a management control section configured to create exchange order information including a collection order for collecting the holding member that the moving work device operates and/or a replenishment order for replenishing the holding member based on arrangement state information including a usage state of the holding member currently loaded to the mounting device and mounting condition information according to which the mounting device performs a mounting process,
wherein the management control section acquires the arrangement state information including a position of the holding member loaded to the supply section of the mounting device and a number of remaining components in accordance with a predetermined driving timing.

2. The moving work management device of claim 1, wherein the management control section creates the exchange order information including replenishment process data for performing replenishment processes for replenishing the holding member to a empty loading section of the supply section prior to production of the mounting target and/or moving process data for performing a moving process for moving the holding member to a use position when production of the mounting target is started.

3. The moving work management device of claim 1, wherein
the mounting device has a mounting loading section in which the mounting head is capable of picking up the component and a buffer loading section in which the mounting head is incapable of picking up the component; and
the management control section arranges the holding member in the buffer loading section as a replenishment process and creates the exchange order information for moving the holding member loaded to the buffer loading section as a moving process in which the holding member is moved to a use position when production of the mounting target is started.

4. The moving work management device of claim 1, wherein the management control section creates the exchange order information in accordance with a driving timing including one or more of a switching timing of the next mounting condition information, a component depletion timing of the holding member, a loading timing at which the holding member is loaded to the loading section by an operator, and a loading release timing at which the holding member is released from the loading section by the operator.

5. The moving work management device of claim 4, wherein the management control section creates the exchange order information for arranging the holding member to be used in the next mounting condition information in accordance with the switching timing, and creates the exchange order information for arranging the holding member to be used in the mounting condition information currently being executed in accordance with one or more of the component depletion timing, the loading timing, and the loading release timing.

6. The moving work management device of claim 1, wherein the management control section creates the exchange order information, which is the exchange order of the holding members that need to change from a currently loading state to the loading section.

7. The moving work management device of claim 1, wherein the management control section outputs the created exchange order information to an external device including one or more of the mounting device, the moving work device, and the management device for managing the mounting system.

8. A mounting system, comprising:
the mounting device: the moving work device, and the moving work management device of claim 1.

9. A moving work management device configured to be used in a mounting system having a mounting device and a moving work device,
the mounting device comprising:
a mounting head configured to mount a component on a mounting target,
a supply section having a loading section for loading a holding member configured to hold the component, and
a mounting control section configured to cause the mounting head to pick up the component from the holding member; and
the moving work device comprising:
a moving control section configured to move the holding member to be collected from the supply section or be replenished to the supply section; and
the moving work management device comprises a management control section configured to create exchange order information including a collection order for collecting the holding member that the moving work device operates and/or a replenishment order for replenishing the holding member based on arrangement state information including a usage state of the holding member currently loaded to the mounting device and mounting condition information according to which the mounting device performs a mounting process,
wherein the management control section creates the exchange order information using one or more priority levels (1) to (3):
(1) a collection process is prioritized over a replenishment process,
(2) priority is given to the collection process or the replenishment process based on the exchange order that yields a shorter moving distance for the moving work device,
(3) in the supply section, the mounting head has a mounting loading section capable of picking up the component and a buffer loading section incapable of picking up the component, and the mounting system has a storage section, aside from the mounting device, configured to store the holding member, and prioritizes the buffer loading section over the storage section as a moving destination of a feeder in the collection process and prioritizes the mounting loading section over the buffer loading section as the moving destination of the holding member in the replenishment process, and
(4) the moving work device has two or more accommodation sections configured to accommodate the holding member, and prioritizes accommodating the holding members in a larger number of accommodation sections when a moving time of the moving work device based on the positions of the holding members to be exchanged is within a predetermined range and allows a creation of an empty accommodation section when the moving time is outside the predetermined range.

\* \* \* \* \*